(12) United States Patent
Wu et al.

(10) Patent No.: US 7,955,918 B2
(45) Date of Patent: Jun. 7, 2011

(54) ROBUST TRANSISTORS WITH FLUORINE TREATMENT

(75) Inventors: Yifeng Wu, Goleta, CA (US); Marcia Moore, Santa Barbara, CA (US); Tim Wisleder, Auckland (NZ); Primit Parikh, Goleta, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 12/581,977

(22) Filed: Oct. 20, 2009

(65) Prior Publication Data
US 2010/0041188 A1 Feb. 18, 2010

Related U.S. Application Data

(62) Division of application No. 11/482,330, filed on Jul. 7, 2006, now Pat. No. 7,638,818.

(60) Provisional application No. 60/715,057, filed on Sep. 7, 2005.

(51) Int. Cl.
*H01L 21/337* (2006.01)
*H01L 21/338* (2006.01)

(52) U.S. Cl. ........ 438/191; 438/172; 438/174; 438/181; 257/E21.403; 257/E21.407

(58) Field of Classification Search .............. 438/172, 438/174, 181, 191; 257/E21.403, E21.407
See application file for complete search history.

(56) References Cited

U.S. PATENT DOCUMENTS

| | | | |
|---|---|---|---|
| 5,128,729 A * | 7/1992 | Alonas et al. ............... 257/433 |
| 5,192,987 A | 3/1993 | Khan et al. ................ 257/183.1 |
| 5,488,237 A | 1/1996 | Kuwata ..................... 257/194 |
| 6,046,464 A | 4/2000 | Schetzina .................. 257/96 |
| 6,064,082 A | 5/2000 | Kawai et al. ............... 257/192 |
| 6,071,780 A | 6/2000 | Okamoto ................... 438/287 |
| 6,316,820 B1 | 11/2001 | Schmitz et al. ............. 257/649 |
| 6,452,221 B1 | 9/2002 | Lai et al. ................... 257/192 |
| 6,533,906 B2 * | 3/2003 | Kawakubo et al. ...... 204/192.22 |
| 6,555,850 B1 | 4/2003 | Sakamoto et al. ........... 257/192 |
| 6,586,781 B2 | 7/2003 | Wu et al. ................... 257/194 |
| 6,706,574 B2 | 3/2004 | Brar ......................... 438/167 |
| 7,161,194 B2 | 1/2007 | Parikh et al. ............... 257/194 |
| 7,230,284 B2 | 6/2007 | Parikh et al. ............... 257/194 |

(Continued)

FOREIGN PATENT DOCUMENTS

EP 1577951 A2 3/2005

(Continued)

OTHER PUBLICATIONS

Official Rejection of Japanese Patent Application No. 2003-535260, dated: Jun. 19, 2009.

(Continued)

*Primary Examiner* — Ngan Ngo
(74) *Attorney, Agent, or Firm* — Koppel, Patrick, Heybl & Philpott

(57) ABSTRACT

A semiconductor device, and particularly a high electron mobility transistor (HEMT), having a plurality of epitaxial layers and experiencing an operating (E) field. A negative ion region in the epitaxial layers to counter the operating (E) field. One method for fabricating a semiconductor device comprises providing a substrate and growing epitaxial layers on the substrate. Negative ions are introduced into the epitaxial layers to form a negative ion region to counter operating electric (E) fields in the semiconductor device. Contacts can be deposited on the epitaxial layers, either before or after formation of the negative ion region.

31 Claims, 2 Drawing Sheets

U.S. PATENT DOCUMENTS

| | | | |
|---|---|---|---|
| 7,408,182 | B1 | 8/2008 | Smart et al. ............ 257/13 |
| 2001/0023964 | A1 | 9/2001 | Wu et al. |
| 2001/0027167 | A1* | 10/2001 | Kawakubo et al. ........ 505/475 |
| 2002/0052076 | A1 | 5/2002 | Khan et al. |
| 2002/0066908 | A1 | 6/2002 | Smith |
| 2002/0167023 | A1 | 11/2002 | Chavarkar et al. |
| 2003/0020092 | A1 | 1/2003 | Parikh et al. |
| 2003/0085409 | A1 | 5/2003 | Shen et al. |
| 2004/0021152 | A1 | 2/2004 | Nguyen et al. |
| 2004/0124435 | A1 | 7/2004 | D'Evelyn et al. |
| 2005/0051796 | A1 | 3/2005 | Parikh et al. |
| 2005/0133816 | A1 | 6/2005 | Fan et al. |
| 2005/0170574 | A1 | 8/2005 | Sheppard et al. |
| 2005/0173728 | A1 | 8/2005 | Saxler |
| 2005/0253168 | A1 | 11/2005 | Wu et al. |
| 2005/0263788 | A1 | 12/2005 | Kunii et al. |
| 2006/0006415 | A1 | 1/2006 | Wu et al. |
| 2006/0121682 | A1 | 6/2006 | Saxler |
| 2006/0163594 | A1 | 7/2006 | Kuzmik |
| 2006/0220062 | A1 | 10/2006 | Green et al. |
| 2006/0220165 | A1 | 10/2006 | Hase |
| 2006/0226442 | A1 | 10/2006 | Zhang et al. |
| 2006/0255366 | A1 | 11/2006 | Sheppard et al. |
| 2007/0018198 | A1 | 1/2007 | Brandes et al. |
| 2008/0017844 | A1 | 1/2008 | Nichols et al. |
| 2008/0124851 | A1 | 5/2008 | Zhang et al. |

FOREIGN PATENT DOCUMENTS

| | | | |
|---|---|---|---|
| WO | WO 2005114743 | A2 | 12/2005 |

OTHER PUBLICATIONS

Patent Abstracts of Japan, Pub. 10-223901, Pub. Date: Aug. 21, 1998.
Khan et al., "AlGaN/GaN Metal-Oxide-Semiconductor Heterostructure Field-Effect Transistors on SiC Substrates", Applied Physics Letters Vo. 77, No. 9, Aug. 2000, pp. 1339-1341.
Extended European Search Report, for related European Application No. 07253716.0, Dated: Jun. 25, 2009.
Examination Report re related European Application No. 01 905 364.4, dated: Jun. 24, 2009.
Examination Report from related European Patent Application No. 02769655.8-1235, Dated: Nov. 3, 2008.
Second Office Action from related China Application No. 02818502.1., Dated: Feb. 19, 2009.
Examination Report from related European Patent Application No. 06851411.6-2203, dated: Jan. 26, 2009.
"Enhancement of Base Conductivity Via the Piezoelectric Effect in AlGaN/GaN HBTs", Asbeck et al., Aug. 18, 1999, Solid State Electronics 44 (2000) 211 219, pp. 211-219.
"New UV Light Emitter based on AlGaN Heterostructures with Graded Electron and Hole Injectors", Johnson et al., XP-002505432, Mat. Res. Soc. Symp. Proc. vol. 743, 2003, Materials Research Society, pp. 1.2.4.1-1.7.4.6.
"Polarization-Induced 3-Dimensional Electron Slabs in Graded AlGaN Layers", Simon et al., XP-002505433, Mater. Res. Soc. Symp. Proc. vol. 892, 2006 Materials Research Society,pp. 1-6.
Examiner's Report from related Canada Patent Application No. 2,399,547, Dated: Mar. 4, 2009.
Result of Examination for related Korean Application No. 10-2004-7001027, Dec. 15, 2009.
IEEE Electron Device Letters, vol. 21, No. 2, Feb. 2000, pp. 63-65, "AlGaN/GaN Metal Oxide Semiconductor Heterostructure Field Effect Transistor,", M. Asif Khan et al.
Japanese Publication No. Hei 11-224881, Aug. 17, 1999, Compound Semiconductor Apparatus.
IEEE Electron Device Letters, vol. 21, No. 9, Sep. 2000, pp. 421-423, "High Breakdown GaN HEMT with Overlapping Gate Structure," N.-Q. Zhang et al.
Examination Report re European Application No. 02 792 174.1-1235, Dated Oct. 7, 2008
Related Extended European Search Report re European Application No. 08250197.4-1235/1973163, Dated: Nov. 6, 2008.
Xing, "High Breakdown Voltage ALGAN-GAN HEMTS Achieved by Multiple Field Plates", IEEE Electron Device Letters,vol. 25, No. 4, Apr. 2004, pp. 161-163.

Related European Examination Report for European Patent Application No. 02769655.8, dated: Nov. 3, 2008.
Related Office Action from Japanese Patent Office re Japanese Patent Application No. 2002-590421, dated: Oct. 21, 2008.
Japanese Patent Application Public Disclosure 2000-68498, Date: Mar. 3, 2000.
Japanese Patent Application Public Disclosure 2001-77353, dated Mar. 23, 2001.
Office Action for family related U.S. Appl. No. 11/799,786, dated Sep. 8, 2008.
Office Action for family related U.S. Appl. No. 11/356,791, dated: Sep. 2, 2008.
Cai et al. "High-Performance Enhancement-Mode AlGaN/GaN HEMTs Using Fluoride-Based Plasma Treatment", Jul. 2005, pp. 435-437, IEEE Electron Device Letters, vol. 26, No. 7.
International Search Report PCT/US2006/026405, Mar. 26, 2008.
Eastman at al., "Umdoped AlGaN/GaN HEMTS for Microwave Power Amplification", IEEE Transaction on Electron Devices, vol. 48, No. 3 Mar. 2001.
Wu et al. "High Al-Content AlGaN/GaN MODFET'S for Ultrahigh Performance", IEEE Electron Device Letters, vol. 19, No. 2 Feb. 1998.
Journal of Applied Physics, "Effect of Polarization Fields on Transport Properties in AlGaN/GaN Heterostructures", Hsu et al., vol. 89, No. 3, Dec. 2001 pp. 1783-1789.
IEEE Electron Device Letters, "AlGaN/GaN Metal Oxide Semiconductor Heterostructure Field Effect Transistor", Kahn et al., vol. 21, No. 2 Feb. 2000, pp. 63-65.
CRC Press, "The Electrical Engineering Handbook" Second Edition, Dorf, p. 994, (1997).
B. Gelmont, et al. "Monte Carlo Simulation of Electron Transport in Gallium Nitride", Journal of Applied Physics, 74(3), Aug. 1993, pp. 1818-1821.
R. Gaska at al., "Electron Transport in AlGaN-GaN Heterostructures Grown on 6H-SiC Substrates", applied physics letters, vol. 72, pp. 707-709, Feb. 1998.
Y. F. Wu et al. "GaN-Based FETS for Microwave Power Amplification", IEICE Trans. Electron, vol. E-82-C, pp. 1895-1905, Nov. 1999.
Y.F. Wu et al.,"Very-High Power Density AlGaN/GaN HEMTS" IEEE Trans. Electron Device, vol. 48, No. 3 Mar. 2001, pp. 586-590.
M. Micovic et al, "AlGaN/GaN Heterojunction Field Effect Transistors Grown by Nitrogen Plasma Assisted Molecular Beam Epitaxy", IEEE Trans. Electron Device, vol. 48 No. 3, pp. 591-596, Mar. 2001.
R. Gaska et al., "High-Temperature Performance of AlGaN/GaN HFET'S on SiC Substrates", IEEE Electron Device Letters, vol. 18, No. 10, Oct. 1997, pp. 492-494.
Ping et al. "DC and Microwave Performance of High-Current AlGaN/GaN Heterostructure Field Effect Transistors Grown on p-TYPE SiC Substrates", IEEE Electron Devices Letters, vol. 19, No. 2, Feb. 1998, pp. 54-.
G. Sullivan et al. "High-Power 10-GHz Operation of A1GaN HFET'S on Insulating SiC", IEEE Electron Device Letters, vol. 19, No. 6, pp. 198-200, Jun. 1998.
Y. F. Wu et al., "30-W/mm GaN HEMTS by Field Plate Optimization", IEEE Electron Device Letters vol. 25, No. 3, pp. 117-119, Mar. 2004.
V. Kumar et al., "AlGaN/GaN HEMTS on SiC with fT of Over 120 GHz", IEEE Electron Device Letters, vol. 23, No. 8, Aug. 2002, pp. 455-457.
Eastman et al. "GaN Materials for High Power Microwave Amplifiers", p. 3-7, 1998 Mat. Res. Soc. Symp. Vo. 512, Materials Research Society.
Office Action from parent U.S. Appl. No. 11/482,330, dated: Feb. 14, 2008.
Response to Office Action from parent U.S. Appl. No. 11/482,330, dated: Mar. 13, 2008.
Office Action from parent U.S. Appl. No. 11/482,330, dated: Jun. 17, 2008.
Response to Office Action from parent U.S. Appl. No. 11/482,330, dated: Jul. 17, 2008.

Office Action from parent U.S. Appl. No. 11/482,330, dated: Nov. 10, 2008.
Response to Office Action from parent application, dated: Feb. 10, 2009.
Office Action from parent U.S. Appl. No. 11/482,330, dated: May 11, 2009.
Response to Office Action from parent U.S. Appl. No. 11/482,330, dated: Jul. 8, 2009.
Notice of Allowance from parent U.S. Appl. No. 11/482,330, dated: Aug. 12, 2009.

* cited by examiner

ROBUST TRANSISTORS WITH FLUORINE TREATMENT

This application is a divisional application of application Ser. No. 11/482,330, which was on filed Jul. 7, 2006 now U.S. Pat. No. 7,638,818, and claims the benefit of U.S. Provisional Patent Application Ser. No. 60/715,057 to Wu et al., filed on Sep. 7, 2005.

This invention was made with Government support under Contract No. N00014-02-C-0306 awarded by Office of Naval Research/DARPA. The Government has certain rights in this invention.

BACKGROUND OF THE INVENTION

1. Field of the Invention

This invention relates to transistors and more particularly to high electron mobility transistors (HEMTs) having a negative ion region to reduce overall operating electric field.

2. Description of the Related Art

High electron mobility transistors (HEMTs) are a common type of solid state transistor that can be fabricated from semiconductor materials such as Gallium Arsenide (GaAs). GaAs based HEMTs are commonly used for high frequency signal amplification in civil and military radar, cellular handsets, and satellite communications. GaAs has higher electron mobility (approximately 6000 $cm^2/V$-s) and a lower source resistance than Si, which allows GaAs based devices to function at higher frequencies. However, GaAs has a relatively small bandgap (1.42 eV at room temperature) and relatively small breakdown voltage, which prevents GaAs based HEMTs from providing high power at high frequencies.

Improvements in the manufacturing of wide bandgap semiconductor materials such as AlGaN/GaN, has focused interest on the development of AlGaN/GaN HEMTs for high frequency, high temperature and high power applications. AlGaN/GaN has large bandgaps, as well as high peak and saturation electron velocity values [B. Belmont, K. Kim and M. Shur, *J. Appl. Phys.* 74, 1818 (1993)]. AlGaN/GaN HEMTs can also have two dimensional electron gas (2DEG) sheet densities in excess of $10^{13}/cm^2$ and relatively high electron mobility (up to 2019 $cm^2/Vs$) [R. Gaska, J. W. Yang, A. Osinsky, Q. Chen, M. A. Khan, A. O. Orlov, G. L. Snider and M. S. Shur, *Appl. Phys. Lett.*, 72, 707 (1998)]. These characteristics allow AlGaN/GaN HEMTs to provide very high voltage and high power operation at RF, microwave and millimeter wave frequencies.

AlGaN/GaN HEMTs have been grown on sapphire substrates and have shown a power density of 4.6 W/mm and a total power of 7.6 W [Y. F. Wu et al., *IEICE Trans. Electron.*, E-82-C, 1895 (1999)]. More recently, AlGaN/GaN HEMTs grown on SiC have shown a power density of 9.8 W/mm at 8 GHz [Y. F. Wu, A. Saxler, M. Moore, R. P. Smith, S. Sheppard, P. M. Chavarkar, T. Wisleder, U. K. Mishra, and P. Parikh, "30 W/mm GaN HEMTs by Field Plate Optimization", EDL, Vol. 25, pp. 117-119, March 2004] and a total output power of 22.9 at 9 GHz [M. Micovic, A Kurdoghlian, P. Janke, P. Hashimoto, D. W. S. Wong, J. S. Moon, L. McCray and C. Nguyen, *IEEE Trans. Electron. Dev.*, 48, 591 (2001)].

U.S. Pat. No. 5,192,987 to Khan et al. discloses GaN/AlGaN based HEMTs grown on a buffer and a substrate. Other AlGaN/GaN HEMTs and field effect transistors (FETs) have been described by Gaska et al., "High-Temperature Performance of AlGaN/GaN HFET's on SiC Substrates," *IEEE Electron Device Letters*, Vol. 18, No 10, October 1997, Page 492; and Ping et al., "DC and Microwave Performance of High Current AlGaN Heterostructure Field Effect Transistors Grown on P-type SiC Substrates," *IEEE Electron Devices Letters*, Vol. 19, No. 2, February 1998, Page 54. Some of these devices have shown a gain-bandwidth product ($f_T$) as high as 67 gigahertz [K. Chu et al. WOCSEMMAD, Monterey, Calif. (February 1998)] and high power densities up to 2.84 W/mm at 10 GHz [G. Sullivan et al., "High Power 10-GHz Operation of AlGaN HFET's in Insulating SiC," *IEEE Electron Device Letters*, Vol. 19, No. 6, Page 198 (June 1998); and Wu et al., *IEEE Electron Device Letters*, Volume 19, No. 2, Page 50 (February 1998)].

Electron trapping and the resulting difference between DC and RF characteristics have been a limiting factor in the performance of GaN based transistors, such as AlGaN/GaN HEMTs. Silicon Nitride (SiN) passivation has been successfully employed to alleviate this trapping problem, which has resulted in high performance devices with power densities over 10 W/mm at 10 Ghz. U.S. Pat. No. 6,586,781, assigned to Cree Inc. (assignee herein) and The Regents of the University of California, discloses methods and structures for reducing the trapping effect in GaN-based transistors. However, due to the high electric fields existing in these structures, charge trapping as well as lower breakdown voltage for high current structures can still be an issue.

SUMMARY OF THE INVENTION

Briefly and in general terms the present invention relates to semiconductor devices having a negative ion region to counter the devices operating electric field, and methods for fabricating the devices. One embodiment of a semiconductor device according to the present invention comprises a plurality of active semiconductor layers experiencing an operating electric (E) field. A negative ion region is included within the plurality of semiconductor layers to counter the operating (E) field.

Another embodiment of a semiconductor device according to the present invention comprises a high electron mobility transistor (HEMT) having a buffer layer and a barrier layer on the buffer layer. A two dimensional electron gas (2DEG) is at the interface between said buffer layer and said barrier layer, and negative ion region in said buffer layer.

Another embodiment of a HEMT according to the present invention comprises a Group-III nitride based buffer layer and Group-III nitride based barrier layer on the buffer layer. A two dimensional electron gas (2DEG) is at the heterointerface between the buffer layer and the barrier layer, with source and drain contacts on the barrier layer. A gate is on the barrier between said source and drain contacts. A fluorine negative ion region is included to counter the operating electric (E) field in the HEMT.

One method for fabricating a semiconductor device according to the present invention comprises providing a substrate and growing epitaxial layers on the substrate. Negative ions are introduced into the epitaxial layers to form a negative ion region to counter operating electric (E) fields in the semiconductor device.

One method for fabricating a high electron mobility transistor (HEMT) according to the present invention, comprises providing a substrate and growing Group-III nitride buffer and barrier layers on the substrate. A negative ion region is formed in the barrier layer, with the negative ion region countering operating electric (E) fields in said HEMT.

These and other aspects and advantages of the invention will become apparent from the following detailed description and the accompanying drawings which illustrate by way of example the features of the invention.

DETAILED DESCRIPTION OF THE INVENTION

Figure 1:
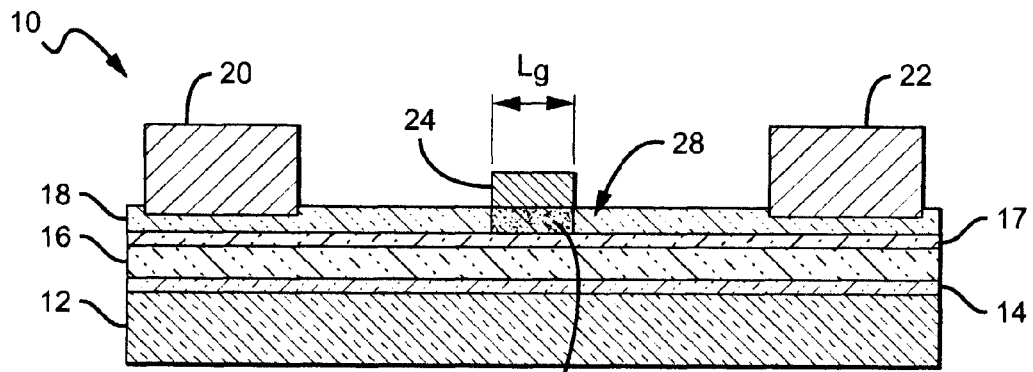
FIG. 1 shows one embodiment of an HEMT according to the present invention.

The present invention relates to semiconductor devices, and in particular transistors, experiencing an electric (E) field during operation. One or more negative ion regions can be included in the device according to the present invention to counter and reduce the transistor's operating E field, thereby improving performance.

Transistors generally include an active region, with metal source and drain electrodes formed in electrical contact with the active region, and a gate formed between the source and drain electrodes for modulating electric fields within the active region. Many different HEMT structures can according to the present invention, including those described in U.S. Pat. No. 6,849,882 to Chavarkar et al. which is incorporated herein by reference as if fully set forth herein. HEMTs typically include a buffer layer and a barrier layer on the buffer layer. A two dimensional electron gas (2DEG) layer/channel is formed at the heterointerface between the buffer layer and the barrier layer. A gate electrode is formed on the barrier layer between source and drain electrodes.

Operating as high power devices, HEMTs can experience a high electric field at the gate-to-drain region, with one possible cause being the high charge density induced by polarization charges at the interface between the buffer and barrier layer. Field plates can be used to tailor the high electric field region and improve device performance, but since the field plates are typically positioned only on the top of the device, the scheme has certain limitations.

The present invention uses negative ion regions to counter the high charge density to reduce this and other electric fields. The negative ion regions are formed by injecting negative ions into the transistors epitaxial layers. Many different materials can be used as the source for negative ions to form the negative ion regions, with one suitable material being fluorine. The doping can take place using many different methods with suitable methods employing plasma treatment and processing using etching systems. Fluorine ions can penetrate into certain epitaxial layers, and in particular Group-III nitride epitaxial layers. The negative ion regions have different profiles with the regions having different depths of ion concentrations in the epitaxial layers.

The invention provides increased flexibility in tailoring the electric field to improve performance. For example, the negative ion regions can reduce the peak electric field in the device, resulting in increased breakdown voltage and reduced trapping. The reduction of the electric field can also yield other benefits such as reduced leakage currents and enhanced reliability.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between elements.

FIG. 1 shows one embodiment of a transistor 10 according to the present invention that is preferably a Group-III nitride based HEMT. It is understood that the invention can be used with other semiconductor devices and other material systems can be used. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN. In a preferred embodiment, the material forming the barrier layer is AlGaN and the material forming the buffer layer is GaN. In alternative embodiments the material of these layers may be GaN, AlGaN, AlGaAs or AlGaInP, as well as other materials.

The HEMT 10 comprises a substrate 12 which can be made from silicon carbide, sapphire, spinet, ZnO, silicon, gallium nitride, aluminum nitride, or any other material or combinations of materials capable of supporting growth of a Group-III nitride material. A suitable silicon carbide substrate is a 4H polytype of silicon carbide, although other silicon carbide polytypes can also be used including 3C, 6H and 15R polytypes. Silicon carbide can have a closer crystal lattice match to Group III nitrides than other substrate materials and can result in Group III nitride films of higher quality. Silicon carbide also has a very high thermal conductivity to enhance thermal dissipation of the emitting device. SiC substrates are available from Cree Inc., of Durham, N.C. and methods for producing them are set forth in the scientific literature as well as in a U.S. Pat. Nos. Re. 34,861; 4,946,547; and 5,200,022. In still other embodiments, the HEMT 10 can be formed without a substrate or the substrate can be removed after formation of the emitter layers.

A nucleation layer 14 (not shown) can be formed on the substrate 12 to reduce the lattice mismatch between the substrate 12 and the next layer in the HEMT 10. The nucleation layer 14 should be approximately 1000 angstroms (Å) thick, although other thicknesses can be used. The nucleation layer 14 can comprise many different materials, with a suitable material being $Al_zGa_{1-z}N$ (0<=z<=1), and layer 14 can be formed on the substrate 12 using known semiconductor growth techniques such as Metal Oxide Chemical Vapor Deposition (MOCVD), Hydride Vapor Phase Epitaxy (HVPE), or Molecular Beam Epitaxy (MBE).

The formation of a nucleation layer 14 can depend on the material used for the substrate 12. For example, methods of forming a nucleation layer 14 on various substrates are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, and 5,739,554 each of which is incorporated herein by reference as if fully set forth herein.

The HEMT 10 further comprises a high resistivity buffer layer 16 formed on the nucleation layer 14. The buffer layer 16 can comprise doped or undoped layers of Group III-nitride materials with a preferred buffer layer 16 made of a Group III-nitride material such as $Al_xGa_yIn_{(1-x-y)}N$ ($0<=x<=1$, $0<=y<=1$, $x+y<=1$). Other materials can also be used for the buffer layer 16 such as GaN that is approximately 2 μm thick, with part of the buffer layer doped with Fe.

A barrier layer 18 is formed on the buffer layer 16 such that the buffer layer 16 is sandwiched between the barrier layer 18 and the nucleation layer 14. Like the buffer layer 16, the barrier layer 18 can comprise doped or undoped layers of Group III-nitride materials and preferable AlGaN/GaN materials. Exemplary HEMT structures are illustrated in U.S. Pat. Nos. 6,316,793, 6,586,781, 6,548,333, 6,849,882 and U.S. Published Patent Application Nos. 2003/0020092 each of which is incorporated by reference as though fully set forth herein. Other nitride based HEMT structures are illustrated in U.S. Pat. Nos. 5,192,987 and 5,296,395 each of which is incorporated herein by reference as if fully set forth herein. The buffer and barrier layers 16, 18 can be made using the same methods used to grow the nucleation layer 14. Electric isolation between the devices is done with mesa etch or ion implementation outside the active HEMT.

Metal source and drain electrodes 20, 22 are formed making ohmic contact through the barrier layer 18, and a gate 24 is formed on the barrier layer 18 between the source and drain electrodes 20, 22. As is known in the art, a two-dimensional electron gas (2DEG) 17 is induced and forms at the heterointerface between the buffer and barrier layers 16, 18 and electric current can flow between the source and drain electrodes 20, 22 through the 2DEG 17 when the gate 24 is biased at the appropriate level. The formation of source and drain electrodes 20, 22 is described in detail in the patents and publications referenced above.

The source and drain electrodes 20, 22 can be made of different materials including but not limited to alloys of titanium, aluminum, gold or nickel. The gate 24 can also be made of different materials including but not limited to gold, nickel, nickel-chromium, platinum, titanium, chromium, alloys of titanium and tungsten, or platinum silicide. The gate 24 can have many different lengths ($L_g$), with a suitable gate length being in the range of 0.1 to 2 microns, although other gate lengths can be used. In one embodiment according to the present invention a preferred gate length ($L_g$) is approximately 0.5 microns.

A negative ion region 26 is included in the barrier layer 18, although in other embodiments it can also extend into the buffer layer 16. A negative ion region is a region of devices epitaxial layer having negative ions introduced or embedded in it to form a region having increased negative ions compared to the surrounding material. As shown, the negative ion region 26 is shown primarily below the gate 24 and extending out as desired to tailor the electric field. As discussed above, the negative ions in the region 26 reduce the electric field in the HEMT 10 by reducing the overall electric field (E). For example, the negative ions can be arranged to oppose the positive charge resulting from polarization at the AlGaN/GaN interface between the buffer and barrier layers 16, 18, thereby reducing the HEMTs net charge.

As also mentioned above, the negative ions in region 26 are preferably fluorine ions that can penetrate to different levels of Group-III nitride semiconductor material. As shown it penetrates into the AlGaN/GaN barrier layer 18 although in other embodiments it can also penetrate into layers below such as the buffer layer 16 or nucleation layer. Fluorine ions can be introduced to penetrate into the layers 16, 18 using many different methods, with a preferred method being a fluorine plasma processing or treatment in etching systems. Suitable etching systems comprise fluorine based dry etch using a reactive ion etch (RIE) or inductively coupled plasma etch (ICP) processes. In other embodiments, ion implantation processes can be used. Different materials can be used in the etch processes, including but not limited to plasma gas chemistry from $CF_4$, $SF_6$, or $CHF_3$. In a preferred embodiment, the etching method should not damage the AlGaN/GaN material during etching, but should provide a source of fluorine ions that penetrate AlGaN/GaN.

The amount of time necessary to achieve the desired depth of penetration will depend on a number of different factors. The rate at which the fluorine ions are injected into the barrier layers 18 and extend into the barrier or buffer layers 18, 16 depends generally on the level of voltage (power) used in the etching process, the flow rate of the gas during the etching process, the concentration of gas, and the length of time the etch is applied to the surface. At higher voltage levels, gas concentrations and gas flow rates, the less time it will take to reach the desired level of penetration. A mask can be included so fluorine ion penetration occurs only in the desired areas to form the desired negative ion region.

The etching process can be customized to provide a different negative ion implementation profile having different depths and widths of negative ion regions, and different sections of the regions can have different ion concentrations or different depths. Many different methods can be used to form this profile, including but not limited to known masking multiple techniques. In HEMTs made of material systems other than AlGaN/GaN, different etching processes that do not damage that material system can be used to introduce negative ions.

The fluorine ions can further be introduced in other areas of the epitaxial layers to provide a negative ion region in other high electron field regions of a transistor. Another example of a high electron field region is at the edge of mesa isolation. Fluorine treatment can be used as a follow-up step of the mesa isolation process to provide a negative ion region to reduce leakage at the place of gate metal crossing the mesa edge, as well as leakage under the gate metal pad.

In operation of the HEMT 10, an electric field can develop at or around the gate-to-drain region 28. The negative ion region 26 is positioned to counter and reduce this electric field resulting in increased breakdown voltage and reduced trapping. The reduction of the electric field can also yield other benefits such as reduced leakage currents and enhanced reliability.

Figure 2:
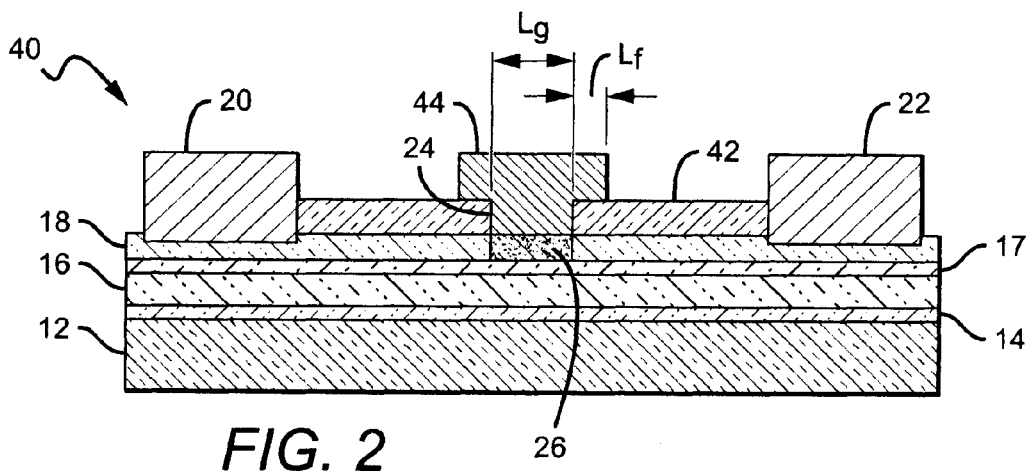
FIG. 2 shows another embodiment of a HEMT according to the present invention having a field plate.

The present invention can be used in devices having other structures/features to tailor the E field, such as field plates. FIG. 2 shows another embodiment of a HEMT 40 according to the present invention also having a substrate 12, AlGaN/GaN nucleation layer 14, AlGaN/GaN buffer layer 16, AlGaN/GaN barrier layer 18, source and drain electrodes 20, 22, and gate 24. A first non-conducting spacer layer 42 is formed over the surface of the barrier layer 18 between the gate 24 and the source and drain electrodes 20, 22. The first spacer layer 42 can comprise a dielectric layer, or a combination of multiple dielectric layers. Different dielectric materials can be used such as a SiN, SiO2, Si, Ge, MgOx, MgNx, ZnO, SiNx, SiOx, alloys or layer sequences thereof. The spacer layer can be many different thicknesses, with a suitable range of thicknesses being approximately 0.05 to 2 microns.

When the spacer layer 42 is formed before device metallization the spacer layer can also comprise an epitaxial material such as a Group III nitride material having different Group III elements such as alloys of Al, Ga, or In, with a suitable spacer layer material being $Al_xGa_{1-x}N$ ($0 \leq x \leq 1$). After epitaxial growth of the barrier layer 18, the first spacer layer 42 can be grown using the same epitaxial growth method. A suitable dielectric spacer layer may also be grown after epitaxial growth of the barrier layer using the same epitaxial growth method.

The first spacer layer 42 is then etched such that the gate 24, source electrode 20 and drain electrode 22 can be properly formed in electrical contact with the 2DEG 17. It is during this etching process that fluorine (negative) ions can be injected into the barrier layer 18 and if desired, may be extended into the buffer layer 16. Gate lines are typically defined in the spacer layer and a space for the gate is opened by etching. Typically, the spacer layer 42 is etched using a fluorine based RIE, and following etching of the spacer layer 42 the barrier layer 18 can be subjected to further fluorine exposure to allow the desired fluorine ions to penetrate into the AlGaN/GaN of the barrier layer 18. In other embodiments, the fluorine ions can be injected into the barrier layer prior to deposition and etching of the spacer layer 42. The fluorine ions are negatively charged and act as a counter dopant to the positive polarization charges in the AlGaN/GaN material system.

A first field plate 44 is formed on the spacer layer 42 extending from the gate 24 toward the drain electrode 22. The field plate can also have a section extending toward the source electrode 20. The spacer layer 26 is arranged to provide isolation between the first field plate 40 and the layers below. The field plate 44 as shown is integral to the gate 24, but in other embodiments can be separate from the gate 24, and electrically coupled to the gate 24 or the source electrode 20.

The field plate 44 can extend different distances $L_f$ over the barrier layer from the edge of the gate 24 with a suitable range of distances being 0.1 to 1.0 micron, although other distances can also be used. The field plate 44 can comprise many different conductive materials with a suitable material being a metal deposited using standard metallization methods. This field plate arrangement can reduce the peak electric field in the device, resulting in increased breakdown voltage, reduced leakage currents and enhanced reliability. The shielding effect of a source-connected field plate can also reduce $C_{gd}$, which enhances input-output isolation. This field plate arrangement can be used in conjunction with the negative ion region 26 described above to further enhance device performance.

Figure 3:
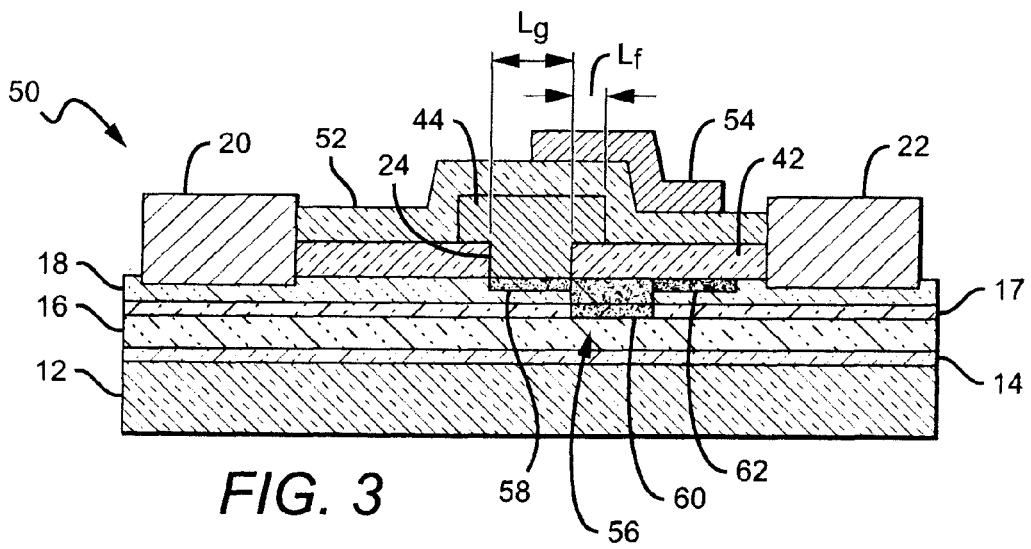
FIG. 3 shows another embodiment of a HEMT according to the present invention having multiple field plates.

FIG. 3 shows another embodiment of a HEMT 50 according to the present invention also having a substrate 12, nucleation layer 14, buffer layer 16, barrier layer 18, source and drain electrodes 20, 22, and gate 24. A spacer layer 42 is included on the barrier layer 18 and between the gate 24 and the source and drain electrodes 20, 22. The spacer layer 42 is etched as described above to provide an opening for the gate 24 and to inject negative ions. A field plate 44 is formed on the spacer layer 42, integral with the gate 24. In other embodiments it can be separate from the gate 24 and electrically connected to the gate 24 or source electrode 20.

HEMT 50 further comprises a second non-conducting spacer layer 52 that can be made of the same material as spacer layer 42. The second field plate 54 is on the spacer layer 42, overlapping the first field plate 44 and gate 24, although in other embodiments it can overlap only the field plate 44, or not overlap either. The second field plate 54 is typically electrically connected to the source electrode 20. The embodiments above provide wide bandgap transistors with improved power at microwave and millimeter wave frequencies. The multiple field plate transistors exhibit simultaneous high gain, high power, and more stable operation due to higher input-output isolation.

The multiple field plate arrangement can also be used in conjunction with the negative ion region 56 that preferably comprises fluorine ions injected into the barrier layer 18 using the methods described above. As shown, the region 56 can comprise sections of different thicknesses that can extend into the buffer layer 16. The first region 58 is primarily under the gate 24 and does not extend into the buffer layer 16. The section 58 is typically formed during etching of the spacer layer 42. The second section 60 is primarily below the first field plate 44 and extends into the buffer layer 16. The third section 62 is primarily below the portion of the second field plate 54 extending toward the drain 22. The second and third sections 60, 62 are typically formed prior to deposition of the spacer layer 42. This tailored negative ion region 56 works in conjunction with the field plates 44, 54 to reduce the electric field and enhance device performance.

Figure 4:
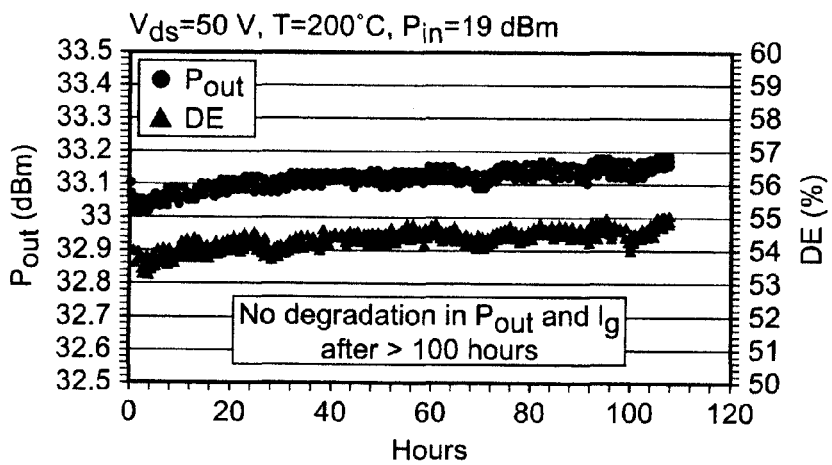
FIG. 4 is a graph showing the results of a 100 hour RF HTOL life test for HEMTs according to the present invention, at 200 C base plate temperature and 50 V drain bias.

FIG. 4 is a graph 70 showing the performance of a 246 μm wide device similar to the HEMT 10 shown in FIG. 2 and described above. The device shows no degradation after 100 hours of operation at 50 V drain bias, 200° C. base-plate temperature, with continuous output power of 8.3 W/mm.

Figure 5:
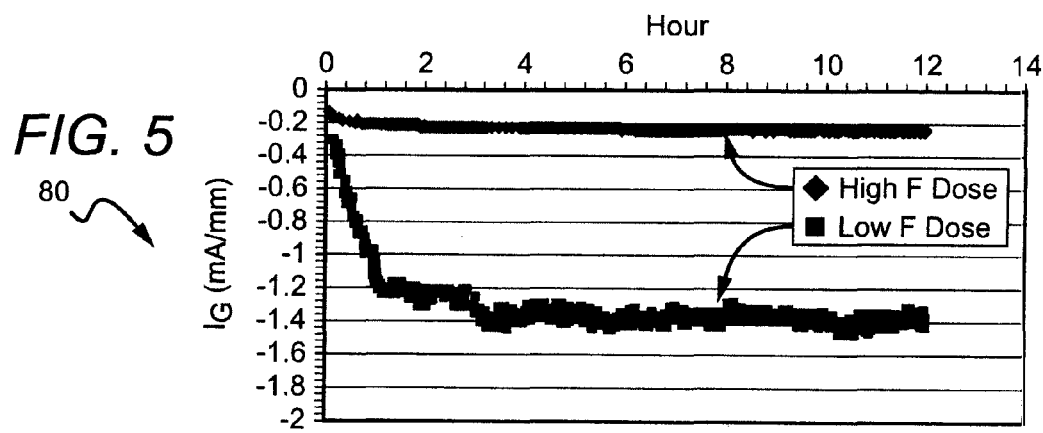
FIG. 5 is a graph showing the results of a high field, high temperature stress test for HEMTs according to the present invention at $V_{ds}$=96 V, $V_{gs}$=−8V and 200° C.

FIG. 5 is a graph 80 showing the performance of two devices, one with low fluorine doses and the other with high doses. Both devices were subjected to a high temperature high electric field stress test, with the high fluorine device exhibiting a lower gate leakage compared to the low dose device. These results support that the level of fluorine-ions helps reduce the overall electric field, thereby improving device performance.

In some semiconductor materials, the negative ions can migrate in the semiconductor material or dissipate from the material under elevated temperatures or electric fields. To reduce migration/dissipation under elevated temperatures, semiconductor device with its negative ion profile can be annealed to stabilize the implanted ions. Many different annealing temperatures and annealing times can be used, with a suitable annealing temperature range being 200°-1000°. To reduce migration/dissipation under elevated electric fields, the semiconductor device with its negative ion profile can be exposed to a known "burn in" process during which a bias can be applied to the device.

Figure 6:
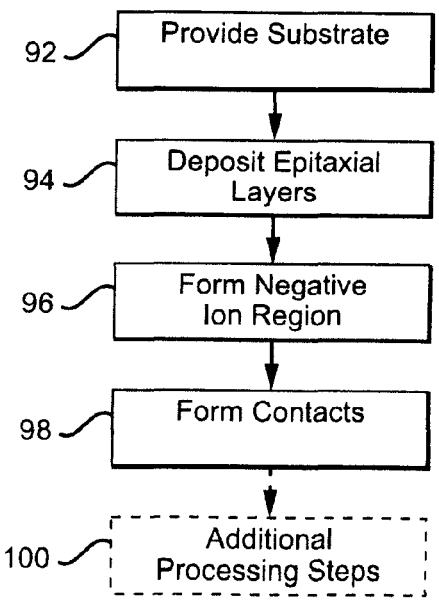
FIG. 6 shows one embodiment according to the present invention for fabricating a semiconductor device with a negative ion region.

FIG. 6 shows one embodiment of a method 90 according to the present invention for fabricating a semiconductor device according to the present invention, and in particular for fabricating a Group-III nitride HEMT. Although the method 90 is shown as series of steps, it is understood that different steps in different sequences can be used in methods according to the present invention.

In step 92, a substrate is provided that can be made of many different materials, with suitable materials being any of those listed for substrate 12 shown in FIG. 1 and described in detail above. In step 94 epitaxial layer(s) are grown on the substrate using any of the known semiconductor such as Metal Oxide Chemical Vapor Deposition (MOCVD), Hydride Vapor Phase Epitaxy (HVPE), or Molecular Beam Epitaxy (MBE). For a HEMT, the epitaxial layers are preferably Group-III nitride layers that include at least a buffer and barrier layer with a 2DEG it the heterointerface between the layers.

In step 96, negative ions can be introduced into the layers epitaxial layer where they penetrate and form a negative ion region. Many different methods can be used to introduce the negative ions, and as mentioned above with a preferred method being a fluorine based dry etch using a reactive ion etch (RIE) or an inductively coupled plasma etch (ICP) process. Different materials can be used in the etch processes as mentioned above and the epitaxial layers should be substantially undamaged by the etch process. The negative ion region should be formed in a location to counter operating electric field in the finished HEMT.

For those embodiments where the negative ion region has a particular depth or concentration profile, additional negative ion introduction steps can be performed. Known masking methods can be employed using steps known in the art. In step 98 source and drain electrodes (contacts) are formed making ohmic with the barrier layer, and a gate 24 is formed on the barrier layer between the source and drain electrodes. Each can be made of the material described above and formed using known processes. In other embodiments, one or both of the source and drain contacts can be formed prior to formation of the negative ion regions. The gate can then be formed after formation of the negative ion region.

It is understood that additional device processing steps 100 can be included in methods according to the present invention. For example, annealing or burn in steps can be included to stabilize the negative ion region as described above. Additional steps can also be performed to form one or more field plates on the device to form the field plate devices described above and shown in FIGS. 2 and 3.

Although the present invention has been described in detail with reference to certain preferred configurations thereof, other versions are possible. Negative ion regions can be used in many different devices according to the present invention, can have many different shapes, and can be in many different locations. Therefore, the spirit and scope of the invention should not be limited to the versions described above.

We claim:

1. A method for fabricating a semiconductor device, comprising:
   providing a substrate;
   growing epitaxial layers on said substrate; and
   introducing negative ions into said epitaxial layers to form a negative ion region to counter operating electric (E) fields in said semiconductor device and forming a gate on one of said epitaxial layers, wherein said negative ion region is arranged at least partially beyond a region below said gate.

2. The method of claim 1, further comprising depositing contacts on said epitaxial layers.

3. The method of claim 1, wherein said negative ions are introduced into said epitaxial layers using plasma processes in etching systems.

4. The method of claim 1, wherein said epitaxial layers are made of Group-III nitride materials and said negative ions comprise fluorine ions.

5. A method for fabricating a high electron mobility transistor (HEMT), comprising:
   providing a substrate;
   growing nitride buffer and barrier layers on said substrate; and
   forming a negative ion region in said barrier layer, said negative ion region countering operating electric (E) fields in said HEMT and depositing a gate on said barrier layer, wherein said negative ion region is arranged at least partially beyond a region below said gate.

6. The method of claim 5, further comprising depositing source and drain contacts on said barrier layer.

7. The method of claim 5, further comprising depositing source and drain contacts on said barrier layer prior to said forming of said negative ion region, and depositing said gate after said forming of said negative ion region.

8. The method of claim 5, wherein said negative ion region comprises fluorine ions.

9. The method of claim 5, wherein said negative ion region is formed by plasma treatment.

10. The method of claim 5, wherein said forming said negative ion region uses plasma gas chemistry from the group $CF_4$, $SF_6$, and $CHF_3$.

11. The method of claim 6, wherein said negative ion region is at least partially under said gate.

12. The method of claim 1, wherein said negative ions are introduced into said epitaxial layers using ion implantation processes.

13. The method of claim 1, further comprising forming a drain on the one of said epitaxial layers, wherein said negative ion region extends beyond an edge of said gate toward said drain.

14. The method of claim 1, wherein said semiconductor device comprises a high electron mobility transistor (HEMT).

15. The method of claim 1, further comprising:
   forming a first spacer layer on one of said epitaxial layers.

16. The method of claim 15, further comprising:
   forming a first field plate on said first spacer layer.

17. The method of claim 16, further comprising:
   forming a second spacer layer on said first field plate.

18. The method of claim 17, further comprising:
   forming a second field plate on said second spacer layer.

19. The method of claim 5, further comprising depositing a drain on said barrier layer, wherein said negative ion region extends beyond an edge of said gate toward said drain.

20. The method of claim 5 wherein said buffer layer and barrier layer comprise Group-III nitride materials.

21. The method of claim 5, wherein said negative ion region is formed by ion implantation processes.

22. A method for fabricating a semiconductor device, comprising:
   growing epitaxial layers; and
   introducing negative ions into said epitaxial layers to form a negative ion region to counter operating electric (E) fields in said semiconductor device and forming a gate on one of said epitaxial layers;
   wherein said negative ion region is arranged at least partially beyond a region below said gate.

23. The method of claim 22 wherein said negative ion region is formed by plasma treatment.

24. The method of claim 22, wherein said negative ion region is formed by use of ion implantation processes.

25. The method of claim 22, further comprising forming a drain on the one of said epitaxial layers, wherein said negative ion region extends beyond an edge of said gate toward said drain.

26. The method of claim 22, wherein said semiconductor device comprises a high electron mobility transistor (HEMT).

27. The method of claim 22, further comprising:
   forming a first spacer layer on one of said epitaxial layers.

28. The method of claim 27, further comprising:
   forming a first field plate on said first spacer layer.

29. The method of claim 28, further comprising:
   forming a second spacer layer on said first field plate.

30. The method of claim 29, further comprising:
   forming a second field plate on said second spacer layer.

31. The method of claim 22 wherein the epitaxial layers are grown on a substrate.

* * * * *